(12) United States Patent
Huang et al.

(10) Patent No.: US 8,339,553 B2
(45) Date of Patent: Dec. 25, 2012

(54) METHOD AND STRUCTURE FOR TOP METAL FORMATION OF LIQUID CRYSTAL ON SILICON DEVICES

(75) Inventors: Herb Huang, Shanghai (CN); Wei Min Li, Shanghai (CN); Fish Ren, Shanghai (CN); Nancy Han, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/897,617

(22) Filed: Oct. 4, 2010
(Under 37 CFR 1.47)

(65) Prior Publication Data
US 2012/0092604 A1    Apr. 19, 2012

(30) Foreign Application Priority Data
Nov. 20, 2009    (CN) .......................... 2009 1 0199230

(51) Int. Cl.
G02F 1/1343    (2006.01)
G02F 1/1345    (2006.01)
G02F 1/1333    (2006.01)
(52) U.S. Cl. .................. 349/139; 349/149; 349/122
(58) Field of Classification Search .................. 349/139, 349/149, 122
See application file for complete search history.

(56) References Cited

U.S. PATENT DOCUMENTS

| 6,521,475 | B1 * | 2/2003 | Chen et al. ...................... 438/34 |
| 6,617,177 | B1 * | 9/2003 | Winer .............................. 438/14 |
| 6,809,337 | B2 * | 10/2004 | Winer .............................. 257/72 |
| 7,936,406 | B2 * | 5/2011 | Huang et al. ................... 349/38 |

FOREIGN PATENT DOCUMENTS
CN    1427285 A    2/2003

* cited by examiner

*Primary Examiner* — Mike Qi
(74) *Attorney, Agent, or Firm* — Kilpatrick Townsend & Stockton LLP

(57) ABSTRACT

The present invention provides an LCOS device having improved bonding pad features. The device has a substrate, a transistor layer overlying the substrate and an interlayer dielectric layer overlying the transistor layer. A first conductive layer is overlying the interlayer dielectric layer and a second interlayer dielectric layer is overlying the first conductive layer. An enlarged opening for a bonding pad structure is in a first portion of the second interlayer dielectric layer. A barrier metal layer is formed within the enlarged opening to form a liner that covers exposed regions of the enlarged opening. A metal material is overlying the liner to fill the enlarged opening. A thickness of an aluminum material is overlying the metal material. The device has a bonding pad structure formed from a first portion of the thickness of the aluminum material and is coupled to the metal material in the enlarged opening.

20 Claims, 5 Drawing Sheets

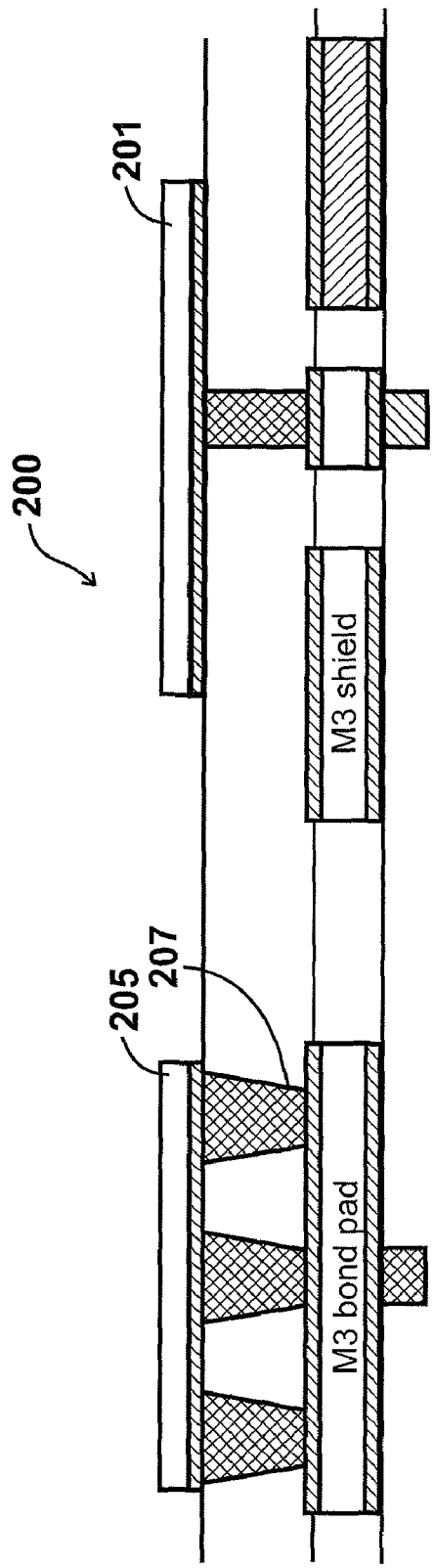
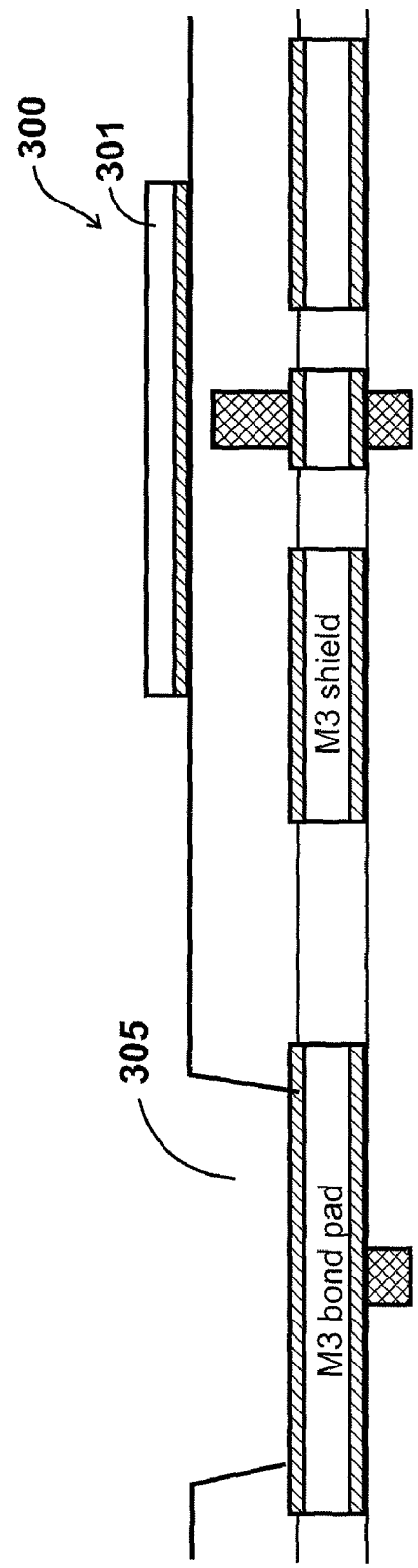
Figure 2 (Prior Art)
Figure 3 (Prior Art)

METHOD AND STRUCTURE FOR TOP METAL FORMATION OF LIQUID CRYSTAL ON SILICON DEVICES

CROSS-REFERENCES TO RELATED APPLICATIONS

This application claims priority to Chinese Application No. 200910199230.4, filed on Nov. 20, 2009, commonly assigned herewith and incorporated by reference herein for all purposes.

BACKGROUND OF THE INVENTION

The present invention is directed to integrated circuits and their processing for the manufacture of electronic devices. More particularly, the invention provides a method for manufacturing a top metal structure for a liquid crystal on silicon ("LCOS") device for displays. But it would be recognized that the invention has a much broader range of applicability.

Electronic display technologies have rapidly developed over the years. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays, commonly called LCDs, used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name (trademark) owned by Texas Instruments Incorporated (TI) of Texas, USA. DLP is often referred to as the use of "micro-mirrors." DLP relies upon a few hundred thousand tiny mirrors laid out in a matrix on a semiconductor chip. Each mirror represents one or more pixels in the projected image. The number of mirrors corresponds to the resolution of the projected image. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc.

Yet another technique is called LCOS, which uses both mirrors and liquid crystals. LCOS uses liquid crystals applied to a reflective mirror substrate. As the liquid crystals "open" or "close," light is reflected or blocked, which modulates the light to create an image for display. Often times, there are at least three LCOS chips, each corresponding to light in red, green, and blue channels. LCOS, however, has many limitations. As merely an example, LCOS is often difficult to manufacture. Additionally, LCOS requires at least the three chips that make the projector bulky and heavy and leads to high costs. Accordingly, LCOS has not been adapted to portable projectors.

From the above, it is seen that an improved technique for processing devices is desired.

BRIEF SUMMARY OF THE INVENTION

According to the present invention, techniques for processing integrated circuits for the manufacture of electronic devices are provided. More particularly, the invention provides a method for manufacturing a top metal structure for a liquid crystal on silicon ("LCOS") device for displays. But it would be recognized that the invention has a much broader range of applicability.

In a specific embodiment, the present invention provides a method for fabricating a liquid crystal on silicon display device. The method includes providing a substrate, e.g., silicon wafer. The method includes forming a transistor layer (e.g., MOS, CMOS) overlying the substrate. The method includes forming an interlayer dielectric layer (e.g., BPSG, FSG, PSG, doped glass) overlying the transistor layer. The method includes forming a first conductive layer (e.g., metal) overlying the interlayer dielectric layer. The method also includes forming a second interlayer dielectric layer (or layers) overlying the first conductive layer. The method forms an enlarged opening for a bonding pad structure in a first portion of the second interlayer dielectric layer and at least one plug opening in a second portion of the second interlayer dielectric layer using a dual damascene structure within the second interlayer dielectric layer. Preferably, etching techniques can be used to form the openings in the second interlayer dielectric layer. The method deposits a barrier metal layer within the enlarged opening and the one plug opening form a liner that covers exposed regions of the enlarged opening and the one plug opening and deposits metal material onto the liner to fill the enlarged opening and the plug opening with the metal material. The method forms a thickness of aluminum material overlying the metal material and patterns the thickness of aluminum material to form a bonding pad structure coupled to the metal material in the enlarged opening and a pixel electrode on the metal material in the one plug opening. Preferably, the bonding pad structure has a substantially similar surface area as a surface area of the metal material in the enlarged opening in the second interlayer dielectric layer.

In an alternative specific embodiment, the present invention provides an LCOS device, which has improved bonding pad features. The device has a substrate, e.g., silicon wafer. The device has a transistor layer overlying the substrate and an interlayer dielectric layer overlying the transistor layer. A first conductive layer is overlying the interlayer dielectric layer and a second interlayer dielectric layer is overlying the first conductive layer. An enlarged opening for a bonding pad structure is in a first portion of the second interlayer dielectric layer and at least one plug opening is in a second portion of the second interlayer dielectric layer. Such openings are characterized by a dual damascene structure within the second interlayer dielectric layer. A barrier metal layer is formed within the enlarged opening and is within the one plug opening form a liner that covers exposed regions of the enlarged opening and the one plug opening. A metal material is overlying the liner to fill the enlarged opening and the plug opening with the metal material. A thickness of aluminum material is overlying the metal material. Preferably, the thickness of aluminum material is less than 2 microns. The device has a bonding pad structure formed from a first portion of the thickness of aluminum material and is coupled (or directly connected mechanically and electrically) to the metal material in the enlarged opening. A pixel electrode is formed from a second portion of the thickness of aluminum material and is overlying the metal material in the one plug opening. The bonding pad structure has a substantially similar surface area as a surface area of the metal material in the enlarged opening in the second interlayer dielectric layer.

Many benefits are achieved by way of the present invention over conventional techniques. For example, the present invention provides an easy to use process that relies upon conventional process technology. In some embodiments, the method provides higher device yields in dies per wafer. Additionally, the method provides a process that is compatible with conventional process technology without substantial modifications to conventional equipment and processes. Preferably, the invention provides for an improved mirror or electrode structure and bonding pad structure for LCOS devices used for displays. Such bonding pad structure can be subjected to mechanical ultrasonic bonding techniques without causing damage to the underlying integrated circuit elements according to a preferred embodiment. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 2 through 3 are simplified cross-sectional view diagrams of metal structures of conventional LCOS devices.

DETAILED DESCRIPTION OF THE INVENTION

According to the present invention, techniques for processing integrated circuits for the manufacture of electronic devices are provided. More particularly, the invention provides a method for manufacturing a top metal structure for a liquid crystal on silicon ("LCOS") device for displays. But it would be recognized that the invention has a much broader range of applicability.

Figure 1:
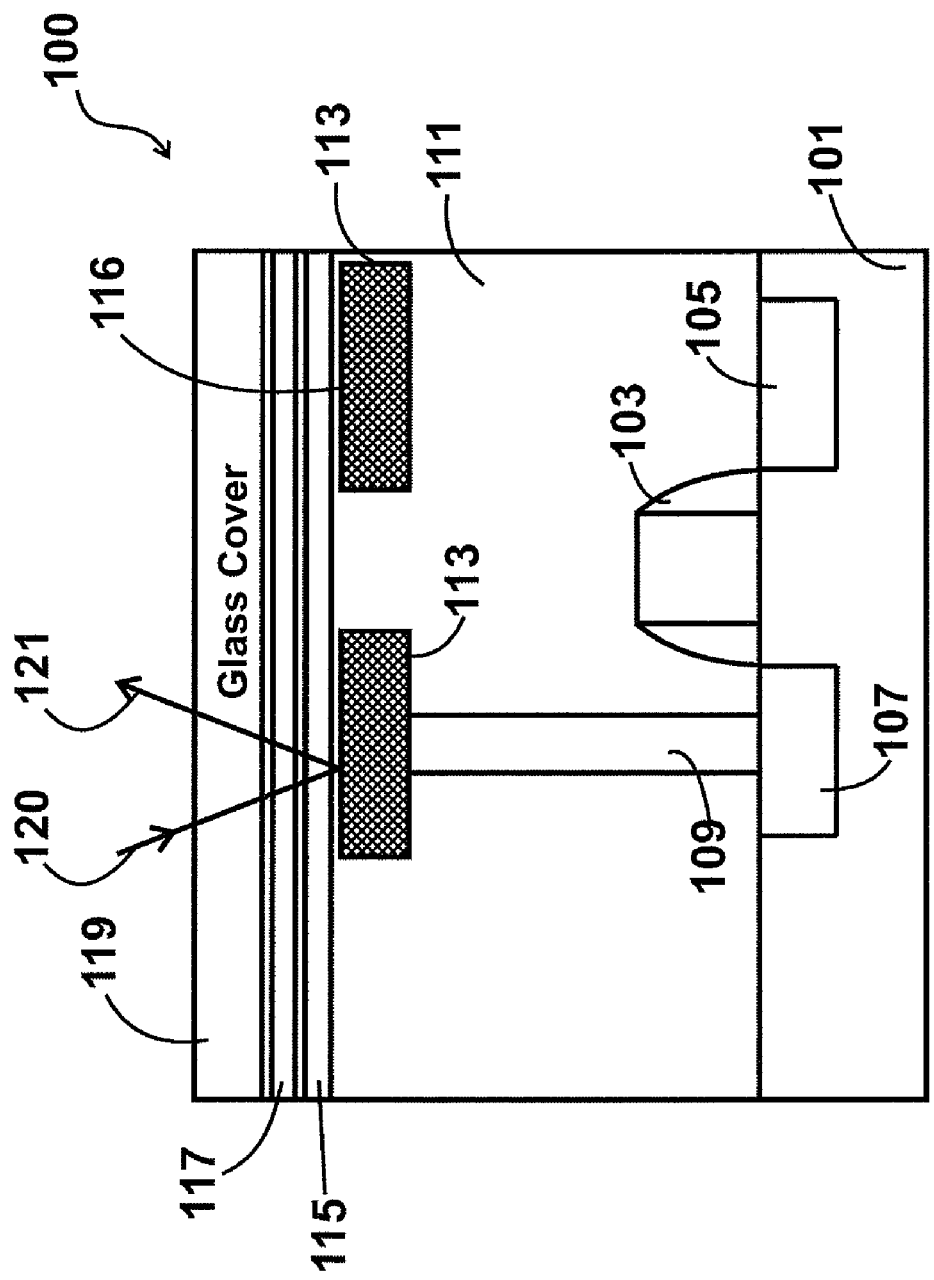
FIG. 1 is a simplified cross-sectional view diagram of an LCOS device according to an embodiment of the present invention.

FIG. 1 is a simplified cross-sectional view diagram of an LCOS device 100 according to an embodiment of the present invention. This diagram is merely an example, which should not unduly limit the scope of the claims herein. One of ordinary skill in the art would recognize many variations, alternatives, and modifications. As shown, the LCOS device 100 has a semiconductor substrate 101, e.g., silicon wafer. An MOS device layer 103 is formed overlying the semiconductor substrate. Preferably, the MOS device layer has a plurality of MOS devices. Each of the MOS devices has a contact region 107 for an electrode and a contact region 105 for a voltage potential. A planarized interlayer dielectric layer 111 is formed overlying the MOS device layer. The LCOS device also has a plurality of recessed regions (e.g., damascene structures) within a portion of the interlayer dielectric layer and a metal layer (e.g., aluminum) to fill each of the recessed regions to form respective plurality of electrode regions 113 corresponding to each of the recessed regions. Preferably, the metal layer has been plated into each of the damascene structures. Each of the electrode regions is respectively coupled to at least one of the MOS devices among the plurality of MOS devices via interconnect structure 109, which may be a plug or other like structure. A protective layer is formed overlying surface regions of each of the plurality of electrode regions to protect the surface regions. A mirror finish 116 is on each of the surface regions. Preferably, the mirror finish is substantially free from dishes and scratches from a chemical mechanical polishing process. Each of the electrodes may have a thickness ranging from about 2000 Angstroms to about 4000 Angstroms and can be at other dimensions. Each of the electrodes represents a pixel element in an array of pixel elements for the LCOS device. Also shown is a liquid crystal film 115 overlying the electrodes. The LCOS device also has a transparent electrode layer (e.g., indium tin oxide) 117 and an overlying glass plate 119 to enclose the multilayered structure. Details on ways of operating the LCOS device can be found throughout the present specification and more particularly below.

To operate the LCOS device, light 120 traverses through the glass cover, through the transparent electrode, and to the liquid crystal film. When the electrode is not biased, the liquid crystal film is essentially in the off position, which does not allow the light to pass therethrough. Rather, light is blocked and does not reflect off of the mirror surface of the electrode. When the electrode is biased via MOS device, the liquid crystal film is in an on-position, which allows light to pass through. The light reflects off of the surface of the electrode and through the liquid crystal film, which is in an on-position. Preferably, the mirror surface is substantially free from imperfections. Accordingly, at least 93% of the incoming light passes out 121 of the LCOS device. Details on ways of fabricating the LCOS device can be found throughout the present specification and more particularly below.

Before discussing different way of fabricating the present device, we would like to briefly describe the limitations of conventional LCOS devices. FIGS. 2 through 3 are simplified cross-sectional view diagrams of metal structures of conventional LCOS devices. As shown, the LCOS device 200 includes a first metal layer overlying an interlayer dielectric film. A second interlayer dielectric film is overlying the first metal layer. An ultra thin bonding pad 205 and an ultra thin mirror pixel 201 are provided on separate spatial portions of the second interlayer dielectric layer. A plurality of plug structures 207 interconnects the bonding pad to the first metal layer, as shown. A plug structure also interconnects the pixel with the first metal layer. Since the bonding pad structure is so thin, it often cracks and/or breaks, including underlying structures, during a subsequent ultrasonic wire bonding or laser wire bonding process.

Referring now to FIG. 3, LCOS device 300 includes a completed pixel structure 301 overlying plug structure and metal layer. The LCOS device also includes an opening 305, which must be formed via etch back after forming the completed pixel structure. The opening is filled with metal to form the conventional bonding pad structure. Since the etchback process is performed, we have discovered that LCOS device 300 is often inefficient to manufacture and may have other limitations caused, in part, by the multiple process steps required for form the bonding pad structures. These and other shortcomings have been overcome, at least in part, by way of the present method and device structures according to embodiments of the present invention.

A method for fabricating a bonding pad structure and pixel electrode for an LCOS device according to an embodiment of the present invention may be outlined as follows:

1. Provide a substrate;
2. Form a layer of transistor elements overlying the substrate;
3. Form an interlayer dielectric layer overlying the layer of transistor elements;
4. Form a first conductive layer (e.g., metal) overlying the interlayer dielectric layer;
5. Form a second interlayer dielectric layer (or layers) overlying the first conductive layer;
6. Form an enlarged opening for a bonding pad structure in a first portion of the second interlayer dielectric layer;
7. Form at least one plug opening in a second portion of the second interlayer dielectric layer using a dual damascene structure within the second interlayer dielectric layer;
8. Deposit a barrier metal layer within the enlarged opening and the one plug opening to form a liner that covers exposed regions of the enlarged opening and the one plug opening;
9. Deposit a metal material onto the liner to fill the enlarged opening and the one plug opening with the metal material;
10. Form a thickness of aluminum material overlying the metal material;
11. Pattern the thickness of aluminum material to form a bonding pad structure coupled to the metal material in the enlarged opening and a pixel electrode on the metal material in the one plug opening, whereupon the bonding pad structure has a substantially similar surface area as a surface area of the metal material in the enlarged opening in the second interlayer dielectric layer;
12. Form a protective layer overlying surface regions of the aluminum layer remaining in the openings;
13. Provide a liquid crystal layer overlying the protective layer, a transparent electrode layer overlying the liquid crystal layer, and a glass layer overlying the transparent electrode layer to form the LCOS device; and
14. Perform other steps, as desired.

The above sequence of steps provides a method according to an embodiment of the present invention. As shown, the method uses a combination of steps including a way of forming a pixel electrode structure and bonding pad structure using a damascene structure for an LCOS device. Other alternatives can also be provided where steps are added, one or more steps are removed, or one or more steps are provided in a different sequence without departing from the scope of the claims herein. Further details of the present method can be found throughout the present specification and more particularly below.

Figure 4:
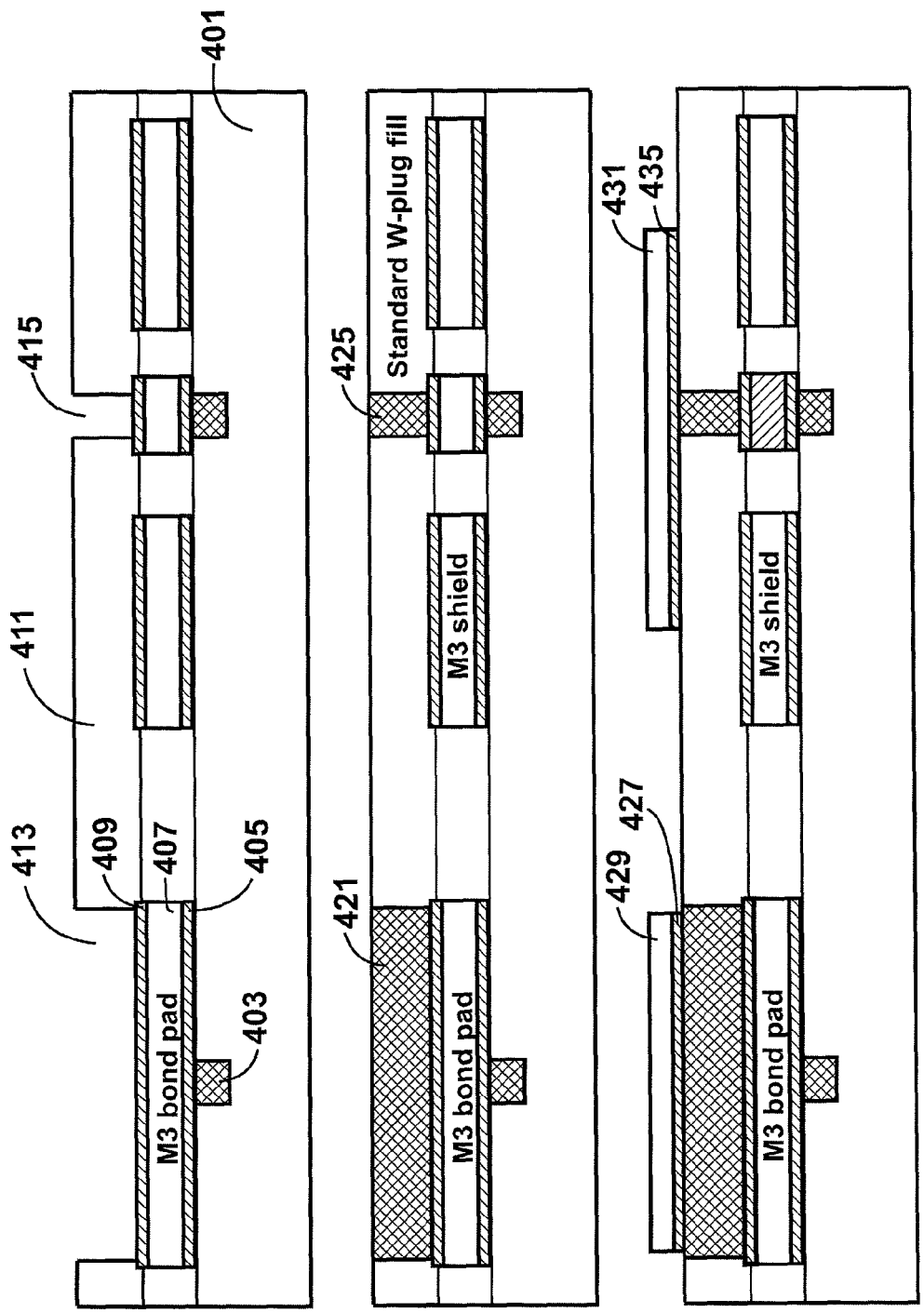
FIG. 4 illustrates a method for forming a metal structure for an LCOS device according to an embodiment of the present invention.

FIG. 4 illustrates a method for forming an LCOS device according to an embodiment of the present invention. This diagram is merely an example, which should not unduly limit the scope of the claims herein. One of ordinary skill in the art would recognize many variations, alternatives, and modifications. These figures focus on forming electrode and bonding pad regions. Referring to FIG. 4 for illustrative purposes, the method begins by providing a semiconductor substrate, e.g., silicon wafer. The method includes forming a transistor layer overlying the substrate. Preferably, the transistor layer has a plurality of MOS devices, each of which includes a first contact region and a second contact region. The method also includes forming an interlayer dielectric layer 401 overlying the transistor layer. The interlayer dielectric layer can be made of borophosphosilicate glass (BPSG), fluorinated silicate glass (FSG), oxide, any combination of these, and the like. Preferably, the interlayer dielectric layer is formed using a chemical vapor deposition process. The method then planarizes the interlayer dielectric layer to form a planarized surface region. Optionally, the dielectric layer has already been planarized.

Referring again to FIG. 4, the method includes forming a first conductive layer, which includes barrier metal 405, metal layer 407, and overlying barrier metal 409. The first conductive layer is connected to plug structure 403, as shown. The method forms an overlying second interlayer dielectric layer 411. The second interlayer dielectric layer can be made of borophosphosilicate glass (BPSG), fluorinated silicate glass (FSG), oxide, any combination of these, and the like. Preferably, the second interlayer dielectric layer is formed using a chemical vapor deposition process. The method then planarizes the second interlayer dielectric layer to form a planarized surface region. Optionally, the second interlayer dielectric layer has already been planarized.

In a specific embodiment, the present method forms an enlarged opening 413 for a bonding pad structure in a first portion of the second interlayer dielectric layer. In a specific embodiment, the enlarged opening has a squared shape having a length of about 40 microns and larger. The method also forms at least one plug opening 415 in a second portion of the second interlayer dielectric layer using a dual damascene structure within the second interlayer dielectric layer. The openings are provided using masking and etching techniques according to a specific embodiment.

The method deposits a barrier metal layer within the enlarged opening and the one plug opening to form a liner that covers exposed regions of the enlarged opening and the one plug opening. The liner layer can be formed from a variety of materials. The liner layer can be sputtered. Here, the liner layer can be a barrier metal layer such as titanium nitride, titanium/titanium nitride, tantalum nitride, tantalum/tantalum nitride, and the like. The liner material acts as a barrier and can also assist in adhesion for overlying materials. Preferably, the liner layer is titanium nitride and has a thickness of about 100 Angstroms and less.

The method also deposits a metal material onto the liner to fill the enlarged opening 421 and fill the plug opening 425 with the metal material. The metal material can be a tungsten or like material that can be deposited to fill an entirety of the openings. In a specific embodiment, the tungsten material is provided using a sputtering process. The method then forms a barrier metal layer 427, 435 overlying the tungsten layer.

Next, the method forms a thickness of an aluminum material overlying the metal material. The aluminum material is patterned to form a bonding pad structure 429 coupled to the metal material in the enlarged opening and to form a pixel electrode 431 on the metal material in the one plug opening. In a specific embodiment, the thickness of the aluminum is less than 2 microns and the aluminum material is an ultra thin aluminum alloy. In another embodiment, the metal material is preferably aluminum, which has been sputtered, deposited, or electro-plated according to a specific embodiment. Preferably, the aluminum is plated using an electro-chemical process known in the art. The plated material has improved gap filling characteristics. The plated material fills up the recessed region and is free from dishing, key holes, etc. Of course, there can be other variations, modifications, and alternatives. As shown, the metal layer has a surface that is substantially planar and has almost no surface defects that influence reflectivity. Each of the electrode regions is respectively coupled to each of the MOS devices among the plurality of MOS devices. Optionally, the method includes a CMP buffing and/or scrubbing step applied to the surface to remove any residual aluminum bearing particles and the like. As also shown, the bonding pad structure has a substantially similar surface area as a surface area of the metal material in the enlarged opening in the second interlayer dielectric layer. Of course, there can be other variations, modifications, and alternatives.

The method also includes forming a protective layer overlying surface regions of each of the plurality of electrode regions to protect the surface regions having a mirror finish for each of the electrode regions. Preferably, at least 93% of the light is reflected back from the mirror finish in completed LCOS devices. The protective layer can be formed by treating the surface of the bare aluminum layer with an oxidizing fluid such as hydrogen peroxide, ozone/water mixtures, and the like. The oxidizing fluid is substantially clean and forms a passivation layer overlying the bare aluminum layer. Depending upon the embodiment, there can be other variations, modifications, and alternatives.

To complete the LCOS device, the method forms a sandwiched layer having liquid crystal materials. Here, a liquid crystal film is formed overlying the electrodes. A transparent electrode structure is formed overlying the liquid crystal film. The method forms a glass plate overlying the transparent electrode. The sandwiched structure is often formed as an assembly, which is later disposed onto surfaces of the electrodes of the LCOS devices. Of course, one of ordinary skill in the art would recognize many variations, alternatives, and modifications.

A method for fabricating an alternative bonding pad structure and pixel electrode for an LCOS device according to an embodiment of the present invention may be outlined as follows:

1. Provide a substrate;
2. Form a layer of transistor elements overlying the substrate;
3. Form an interlayer dielectric layer overlying the layer of transistor elements;
4. Form a first conductive layer (e.g., metal) overlying the interlayer dielectric layer;
5. Form a second interlayer dielectric layer (or layers) overlying the first conductive layer;
6. Form an enlarged opening for a bonding pad structure in a first portion of the second interlayer dielectric layer;
7. Form at least one plug opening in a second portion of the second interlayer dielectric layer using a dual damascene structure within the second interlayer dielectric layer;
8. Deposit a barrier metal layer within the enlarged opening and within the one plug opening to form a liner that covers exposed regions of the enlarged opening and the one plug opening (preferably deposition occurs simultaneously);
9. Deposit a first aluminum material onto the liner to fill the enlarged opening and to fill the one plug opening with the first aluminum material (preferably the deposition occurs simultaneously at the enlarged opening and the one plug opening);
10. Form a thickness of a second aluminum material overlying the first aluminum material;
11. Pattern the thickness of the second aluminum material to form a bonding pad structure coupled to the first aluminum material in the enlarged opening and a pixel electrode on the first aluminum material in the one plug opening, whereupon the bonding pad structure has a substantially similar surface area as a surface area of the first aluminum material in the enlarged opening in the second interlayer dielectric layer;
12. Form a protective layer overlying surface regions of the second aluminum layer remaining in the openings;
13. Provide a liquid crystal layer overlying the protective layer, a transparent electrode layer overlying the liquid crystal layer, and a glass layer overlying the transparent electrode layer to form the LCOS device; and
14. Perform other steps, as desired.

The above sequence of steps provides a method according to an embodiment of the present invention. As shown, the method uses a combination of steps including a way of forming a pixel electrode structure and bonding pad structure using a damascene structure for an LCOS device, in which a first aluminum material is deposited into the enlarged opening for a bonding pad structure and into a plug opening for a pad electrode. A thickness of a second aluminum material is then deposited over the first aluminum material. Other alternatives can also be provided where steps are added, one or more steps are removed, or one or more steps are provided in a different sequence without departing from the scope of the claims herein. Further details of the present method can be found throughout the present specification and more particularly below.

Figure 5:
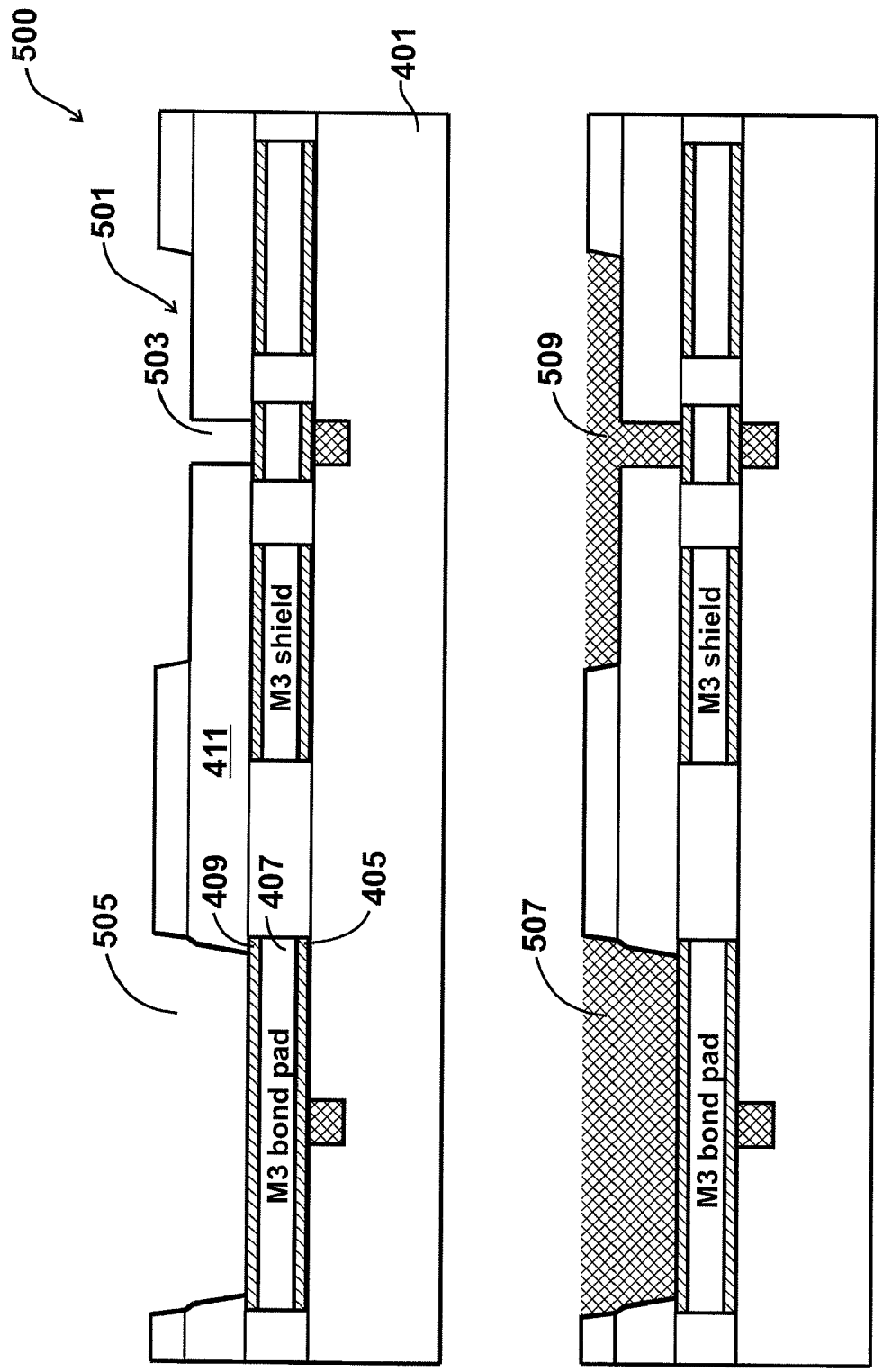
FIG. 5 illustrates a method for forming a metal structure for an LCOS device according to an embodiment of the present invention.

FIG. 5 illustrates a method 500 for forming an LCOS device according to an embodiment of the present invention. This diagram is merely an example, which should not unduly limit the scope of the claims herein. One of ordinary skill in the art would recognize many variations, alternatives, and modifications. These figures focus on forming electrode and bonding pad regions. Like reference numbers may be used in this embodiment as the other embodiments without unduly limiting the scope of the claims herein. Referring to FIG. 5 for illustrative purposes, the method begins by providing a semiconductor substrate, e.g., silicon wafer. The method includes forming a transistor layer overlying the substrate. Preferably, the transistor layer has a plurality of MOS devices, each of which includes a first contact region and a second contact region. The method also includes forming an interlayer dielectric layer 401 overlying the transistor layer. The dielectric layer can be made of borophosphosilicate glass (BPSG), fluorinated silicate glass (FSG), oxide, any combination of these, and the like. Preferably, the dielectric layer is formed using a chemical vapor deposition process. The method then planarizes the interlayer dielectric layer to form a planarized surface region. Optionally, the dielectric layer has already been planarized.

Referring again to FIG. 5, the method includes forming a first conductive layer, which includes barrier metal 405, metal layer 407, and overlying barrier metal 409. The first conductive layer is connected to a plug structure 503, as shown. The method forms an overlying second interlayer dielectric layer 411. The dielectric layer can be made of borophosphosilicate glass (BPSG), fluorinated silicate glass (FSG), oxide, any combination of these, and the like. Preferably, the dielectric layer is formed using a chemical vapor deposition process. The method then planarizes the interlayer dielectric layer to form a planarized surface region. Optionally, the dielectric layer has already been planarized.

In a specific embodiment, the present method forms an enlarged opening 505 for a bonding pad structure in a first portion of the second interlayer dielectric layer. The method also forms at least one plug opening 503 in a second portion of the second interlayer dielectric layer, which is within a larger opening 501, using a dual damascene structure within the second interlayer dielectric layer. The openings are provided using masking and etching techniques according to a specific embodiment.

The method deposits a barrier metal layer within the enlarged opening and the one plug opening to form a liner that covers exposed regions of the enlarged opening and the one plug opening. The liner layer can be formed from a variety of materials. The liner layer can be sputtered. Here, the liner layer can be a barrier metal layer such as titanium nitride, tantalum nitride, and the like. The liner material acts as a barrier and can also assist in adhesion for overlying materials. Preferably, the liner layer is titanium nitride and has a thickness of about 100 Angstroms and less.

The method also deposits a metal material onto the liner to fill the enlarged opening 507 and fill the one plug opening 509, including the larger opening for a pixel electrode, with the metal material. The metal material can be an aluminum material that can be deposited to fill an entirety of the openings. In a specific embodiment, the aluminum material is first deposited using a sputtering process. Next, the method forms a thickness of aluminum material overlying the metal material. The thickness of aluminum material is patterned to form a bonding pad structure coupled to the metal material in the enlarged opening and to form a pixel electrode on the metal material in the one plug opening. Preferably, the metal material is aluminum, which has been sputtered, deposited, or electro-plated according to a specific embodiment. Preferably, the aluminum is plated using an electro-chemical process. The plated material has improved gap filling characteristics. The plated material fills up the recessed region and is free from dishing, key holes, etc. Of course, there can be other variations, modifications, and alternatives. As shown, the metal layer has a surface that is substantially planar and has almost no surface defects that influence reflectivity. Each of the electrode regions is respectively coupled to each of the MOS devices among the plurality of MOS devices. Optionally, the method includes a CMP buffing and/or scrubbing step applied to surface to remove any residual aluminum bearing particles and the like. As also shown, the bonding pad structure has a substantially similar surface area as a surface area of the metal material in the enlarged opening in the second interlayer dielectric layer. Of course, there can be other variations, modifications, and alternatives.

The method also includes forming a protective layer overlying surface regions of each of the plurality of electrode regions to protect the surface regions having a mirror finish for each of the electrode regions. Preferably, at least 93% of the light is reflected back from the mirror finish in completed LCOS devices. In a specific embodiment, the pixel electrode is characterized by a size of about eight by eight microns in dimension. The protective layer can be formed by treating the surface of the bare aluminum layer with an oxidizing fluid such as hydrogen peroxide, ozone/water mixtures, and the like. The oxidizing fluid is substantially clean and forms a passivation layer overlying the bare aluminum layer. Depending upon the embodiment, there can be other variations, modifications, and alternatives.

To complete the LCOS device, the method forms a sandwiched layer having liquid crystal materials. Here, a liquid crystal film is formed overlying the electrodes. A transparent electrode structure is formed overlying the liquid crystal film. The method forms a glass plate overlying the transparent electrode. The sandwiched structure is often formed as an assembly, which is later disposed onto surfaces of the electrodes of the LCOS devices. Of course, one of ordinary skill in the art would recognize many variations, alternatives, and modifications.

Figure 6:
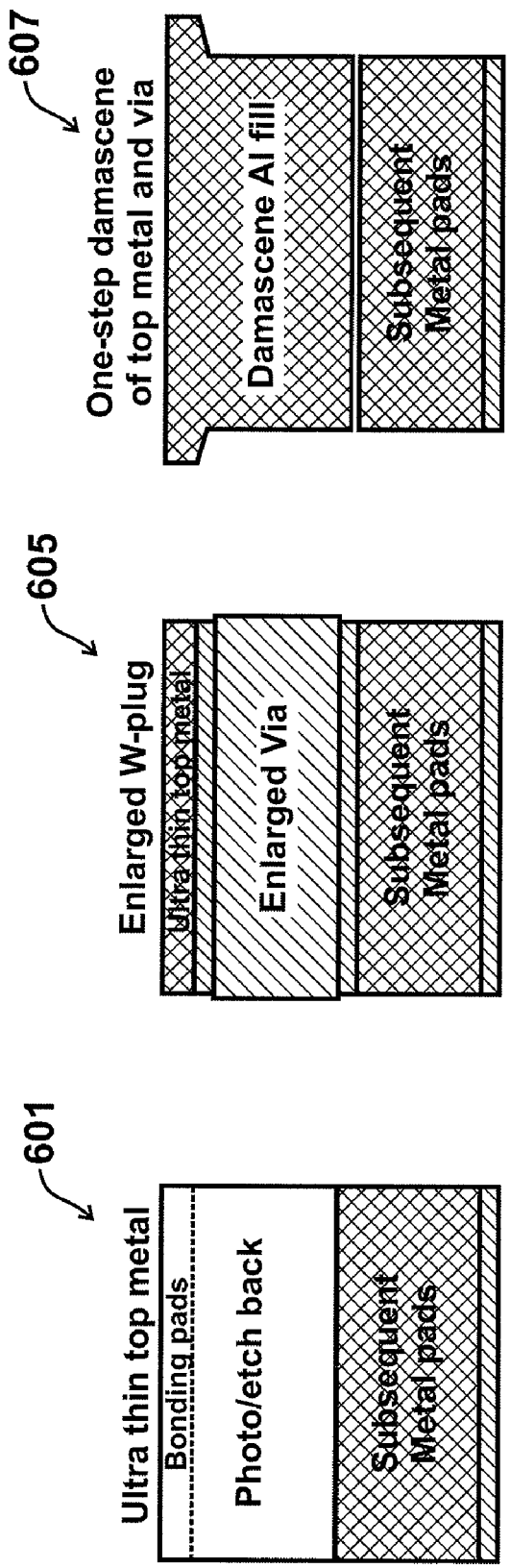
FIG. 6 illustrates various integrated bonding pad structures including a conventional pad structure and others according to embodiments of the present invention.

FIG. 6 illustrates various integrated bonding pad structures including a conventional pad structure and others according to embodiments of the present invention. As shown, the structures include conventional bonding pad 601, which uses an etch back process. Such etch back process is time consuming and prone to process and/or reliability limitations. Integrated bonding pad structures according to embodiments of the present invention include enlarged tungsten plug 605 structure and one step dual damascene structure 607, which have been described in detail above.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a liquid crystal on silicon display device, the method comprising:
   providing a substrate;
   forming a transistor layer overlying the substrate;
   forming an interlayer dielectric layer overlying the transistor layer;
   forming a first conductive layer overlying the interlayer dielectric layer;
   forming a second interlayer dielectric layer overlying the first conductive layer;
   forming an enlarged opening for a bonding pad structure in a first portion of the second interlayer dielectric layer and at least one plug opening in a second portion of the second interlayer dielectric layer using a dual damascene structure within the second interlayer dielectric layer;
   simultaneously depositing a barrier metal layer within the enlarged opening and within the one plug opening to form a liner that covers exposed regions of the enlarged opening and the one plug opening;
   simultaneously depositing metal material onto the liner to fill the enlarged opening and fill the one plug opening with the metal material;
   forming a thickness of aluminum material overlying the metal material; and
   patterning the thickness of aluminum material to form a bonding pad structure coupled to the metal material in the enlarged opening and a pixel electrode on the metal material in the one plug opening;
   whereupon the bonding pad structure has a substantially similar surface area as a surface area of the metal material in the enlarged opening in the second interlayer dielectric layer.

2. The method of claim 1 wherein the second interlayer dielectric layer comprises a doped silicon glass.

3. The method of claim 1 wherein the pixel electrode is a pixel element in one of a plurality of pixel elements for the liquid crystal on silicon display device.

4. The method of claim 1 wherein the barrier metal layer comprises titanium nitride.

5. The method of claim 1 wherein the first interlayer dielectric layer is BPSG.

6. The method of claim 1 wherein a surface region of the pixel electrode is free from dishing or scratching from a chemical mechanical planarization process.

7. The method of claim 1 wherein the pixel electrode is characterized by a reflectivity of 93% and greater.

8. The method of claim 1 wherein the metal material comprises a tungsten bearing material.

9. The method of claim 1 wherein the enlarged opening has a length of about 40 microns and greater.

10. The method of claim 1 wherein the thickness of aluminum material is characterized by an ultra thin material.

11. An LCOS device comprising:
a substrate;
a transistor layer overlying the substrate;
an interlayer dielectric layer overlying the transistor layer;
a first conductive layer overlying the interlayer dielectric layer;
a second interlayer dielectric layer overlying the first conductive layer;
an enlarged opening for a bonding pad structure in a first portion of the second interlayer dielectric layer and at least one plug opening in a second portion of the second interlayer dielectric layer characterized by a dual damascene structure within the second interlayer dielectric layer;
a barrier metal layer formed within the enlarged opening and within the one plug opening form a liner that covers exposed regions of the enlarged opening and the one plug opening;
a metal material overlying the liner to fill the enlarged opening and the plug opening with the metal material;
a thickness of aluminum material overlying the metal material, the thickness of aluminum material being less than 2 microns; and
a bonding pad structure formed from a first portion of the thickness of aluminum material and coupled to the metal material in the enlarged opening;
a pixel electrode formed from a second portion of the thickness of aluminum material and overlying the metal material in the one plug opening;
whereupon the bonding pad structure has a substantially similar surface area as a surface area of the metal material in the enlarged opening in the second interlayer dielectric layer.

12. The device of claim 11 wherein the second interlayer dielectric layer comprises a doped silicon glass.

13. The device of claim 11 wherein the pixel electrode is a pixel element in one of a plurality of pixel elements for the liquid crystal on silicon display device.

14. The device of claim 11 wherein the barrier metal layer comprises titanium nitride.

15. The device of claim 11 wherein the first interlayer dielectric layer is BPSG.

16. The device of claim 11 wherein a surface region of the pixel electrode is free from dishing or scratching from a chemical mechanical planarization process.

17. The device of claim 11 wherein the pixel electrode is characterized by a reflectivity of 93% and greater.

18. The device of claim 11 wherein the metal material comprises a tungsten bearing material.

19. The device of claim 11 wherein the metal material comprises an aluminum bearing material.

20. The device of claim 11 wherein the thickness of aluminum material is characterized as an ultra-thin material.

* * * * *